(12) United States Patent
Carver et al.

(10) Patent No.: US 7,208,795 B2
(45) Date of Patent: Apr. 24, 2007

(54) LOW-COST, LOW-VOLTAGE SINGLE-LAYER POLYCRYSTALLINE EEPROM MEMORY CELL INTEGRATION INTO BICMOS TECHNOLOGY

(75) Inventors: Damian A. Carver, Colorado Springs, CO (US); Muhammad I. Chaudhry, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 57 days.

(21) Appl. No.: 11/136,140

(22) Filed: May 24, 2005

(65) Prior Publication Data

US 2006/0267071 A1    Nov. 30, 2006

(51) Int. Cl.
*H01L 29/788* (2006.01)
*H01L 21/8238* (2006.01)
(52) U.S. Cl. .............. 257/315; 257/314; 257/E29.17; 257/E29.309; 438/201; 438/288; 438/573
(58) Field of Classification Search ............... 257/314, 257/655, E21.68, 315, E29.17, E29.309; 438/201, 202, 288, 573, 652
See application file for complete search history.

(56) References Cited

U.S. PATENT DOCUMENTS

| | | | |
|---|---|---|---|
| 5,248,624 A | 9/1993 | Icel et al. | 437/31 |
| 5,909,400 A | 6/1999 | Bertin et al. | 365/187 |
| 6,022,778 A * | 2/2000 | Contiero et al. | 438/268 |
| 6,025,625 A | 2/2000 | Chi | 257/315 |
| 6,172,392 B1 * | 1/2001 | Schmidt et al. | 257/315 |
| 6,208,559 B1 * | 3/2001 | Tu et al. | 365/185.18 |
| 6,438,030 B1 | 8/2002 | Hu et al. | 365/185.18 |
| 6,532,170 B1 * | 3/2003 | Madurawe et al. | 365/185.1 |

* cited by examiner

*Primary Examiner*—Long K. Tran
(74) *Attorney, Agent, or Firm*—Schneck & Schneck; Thomas Schneck

(57) ABSTRACT

An EEPROM memory transistor having a floating gate. The floating gate is formed using a BiCMOS process and has a first sinker dopant region proximate to a tunnel diode window, and a second sinker dopant region proximate to a coupling capacitor region. An optional third sinker region may be formed proximate to a source junction of the EEPROM memory transistor. Also, a shallow trench isolation (STI) region may be formed between the first and second sinker dopant regions.

28 Claims, 5 Drawing Sheets

( VIEW BB )

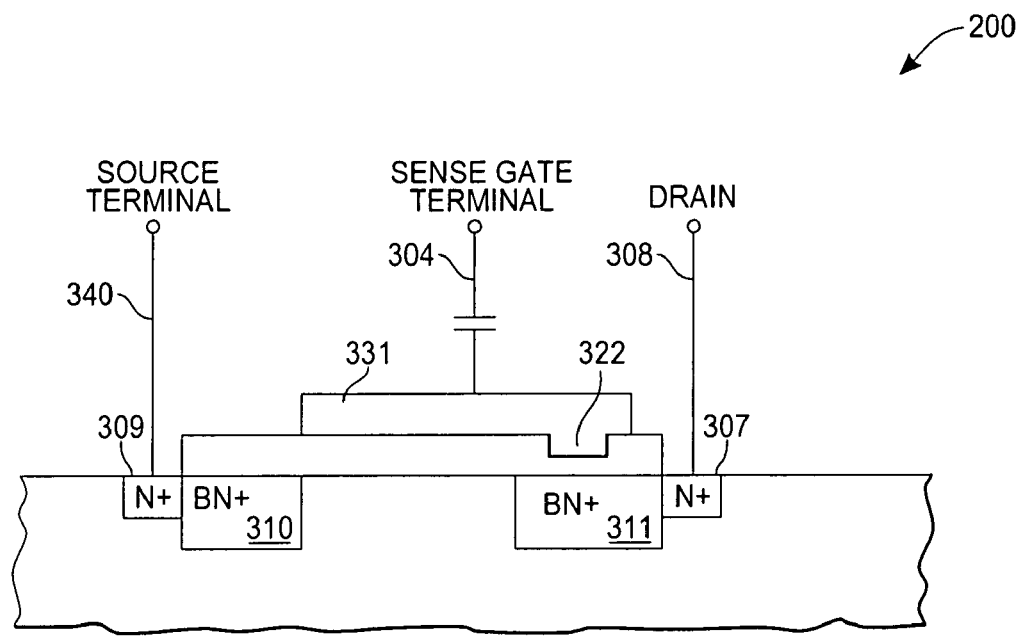
*Fig._3* ( VIEW AA )
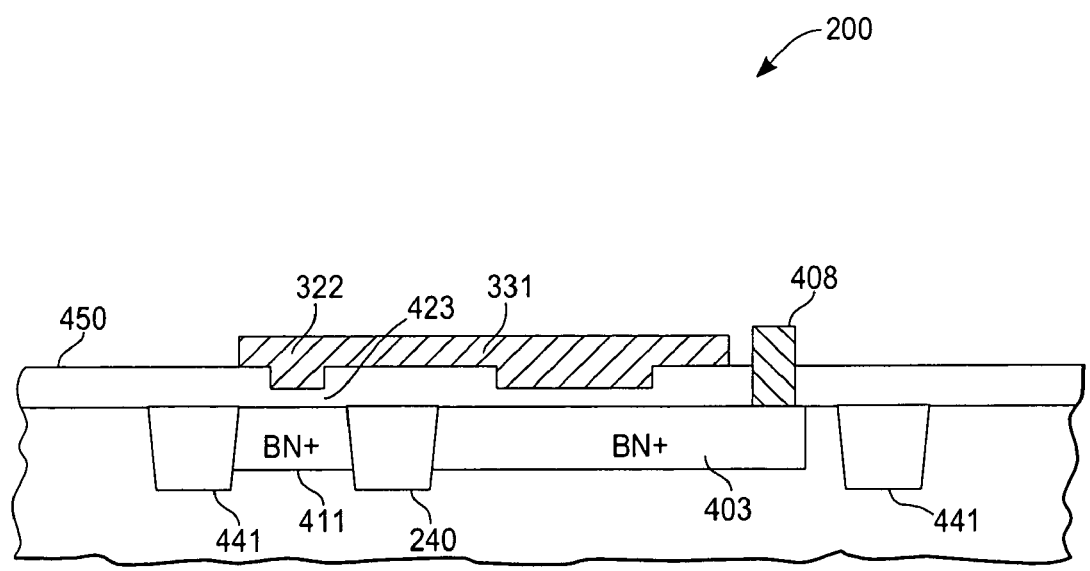
*Fig._4* ( VIEW BB )

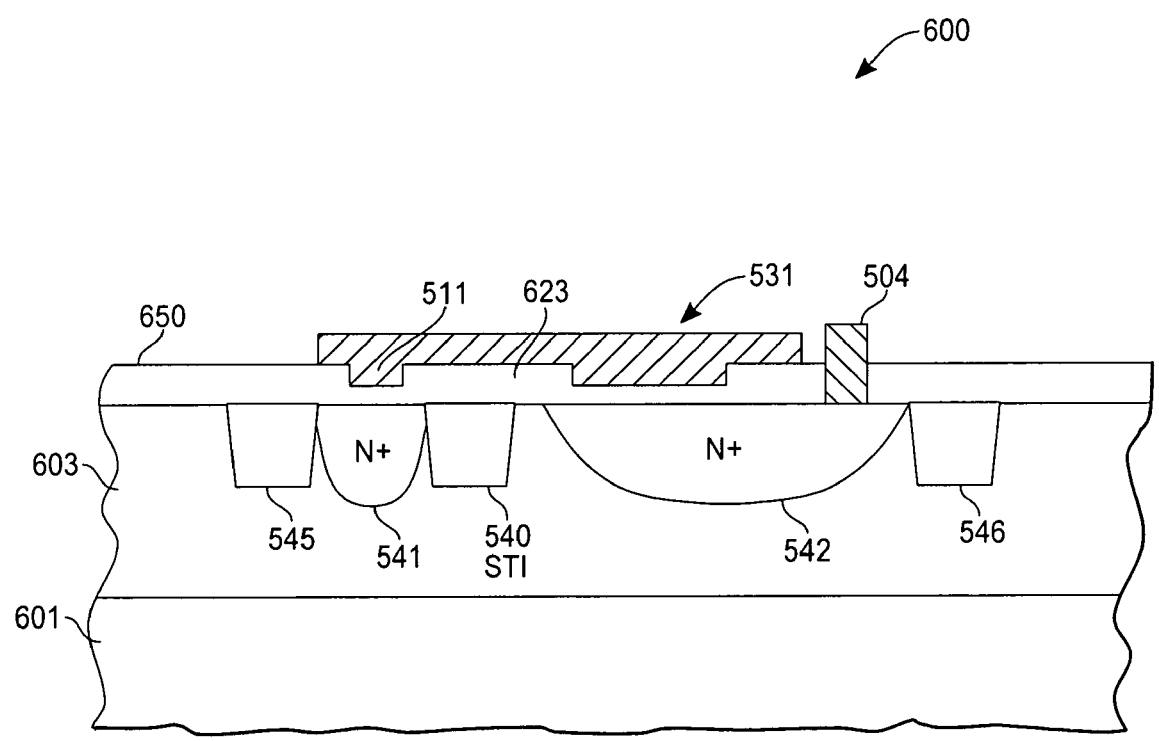
Fig. 6 (VIEW CC)

LOW-COST, LOW-VOLTAGE SINGLE-LAYER POLYCRYSTALLINE EEPROM MEMORY CELL INTEGRATION INTO BICMOS TECHNOLOGY

TECHNICAL FIELD

The present invention relates generally to methods fabricating semiconductor devices, specifically to a BiCMOS process for fabricating an EEPROM memory cell.

BACKGROUND ART

In BiCMOS technology processes, both bipolar and CMOS devices are formed on the same substrate or chip. In certain applications, it is desirable to form an MOS EEPROM memory cell on the same substrate as other bipolar circuits. A single poly EEPROM memory cell uses a coupling capacitor to supply a voltage to an oxide tunnel diode window, and traditionally, a shallow implant or buried layer (BN+) is used to dope active regions under the tunnel diode window region and the coupling capacitor region. The highly n-doped regions are electrically isolated from other proximate transistors for proper functioning of the EEPROM by forming a shallow trench isolation (STI) field.

Process steps to develop sinker implants in a bipolar or BiCMOS processes typically drive the sinker implant or dopant below the depth of an STI. U.S. Pat. No. 5,248,624 to Icel et al. entitled "Method Of Making Isolated Vertical PNP Transistor in a Complementary BiCMOS Process with EEPROM Memory" uses a sinker in the formation of bipolar transistors, but only for improving the isolation of a vertical PNP transistor. U.S. Pat. No. 6,438,030 to Hu et al. entitled "Non-volatile Memory, Method of Manufacture, and Method of Programming" describes the formation of shallow trench isolation structures and p-well implants to isolate transistor devices, however, no sinker implants are used.

Accordingly, what is needed is an improved process and structure integrating an MOS EEPROM memory cell into a BiCMOS process without adding additional masks or process steps and potentially integrating bipolar process steps with MOS process steps.

SUMMARY OF THE INVENTION

An exemplary embodiment of the present invention provides a low-cost, single layer polycrystalline EEPROM memory cell that uses an NPN sinker implant or dopant under an oxide tunnel diode window and coupling capacitor. A method of integrating a low-cost, low-voltage EEPROM into BiCMOS technology uses a deep collector (sinker) implant, available in bipolar manufacturing process technology, to form N+ regions under the oxide of the EEPROM memory transistor tunnel diode window (TDW) and coupling capacitor.

In a conventional EEPROM transistor, the N+ regions, having a junction depth of approximately 0.15 micrometers, are formed using a shallow implant process. To reduce the cost of integrating an EEPROM memory cell into a BiCMOS process technology, a sinker implant replaces the shallow implant. The layout of the sinker implant is modified to keep a high breakdown voltage between the active regions of the EEPROM transistor. Since the sinker is a deep implant, a substrate is doped, and the doped region extends under a shallow trench isolation (STI) field. Modification of the sinker implant includes implanting multiple separate sinker regions where each sinker region is proximate to the active regions of the tunnel diode window and the coupling capacitor. However, each sinker region is separate and spaced apart so each doped region remains electrically separate.

One advantage of integrating separate sinker implants into the formation of the EEPROM memory cell using a BiCMOS process reduces the number of process steps and/or eliminates the requirement of adding mask or processing steps to form a shallow implant.

BRIEF DESCRIPTION OF THE DRAWINGS

FIG. 3 is a first cross sectional view of the exemplary EEPROM memory transistor of FIG. 2.

FIG. 4 is a second cross sectional view of the exemplary EEPROM memory transistor of FIG. 2.

FIG. 6 is a second cross sectional view of the exemplary EEPROM memory transistor of FIG. 5.

DETAILED DESCRIPTION OF THE INVENTION

Figure 1:
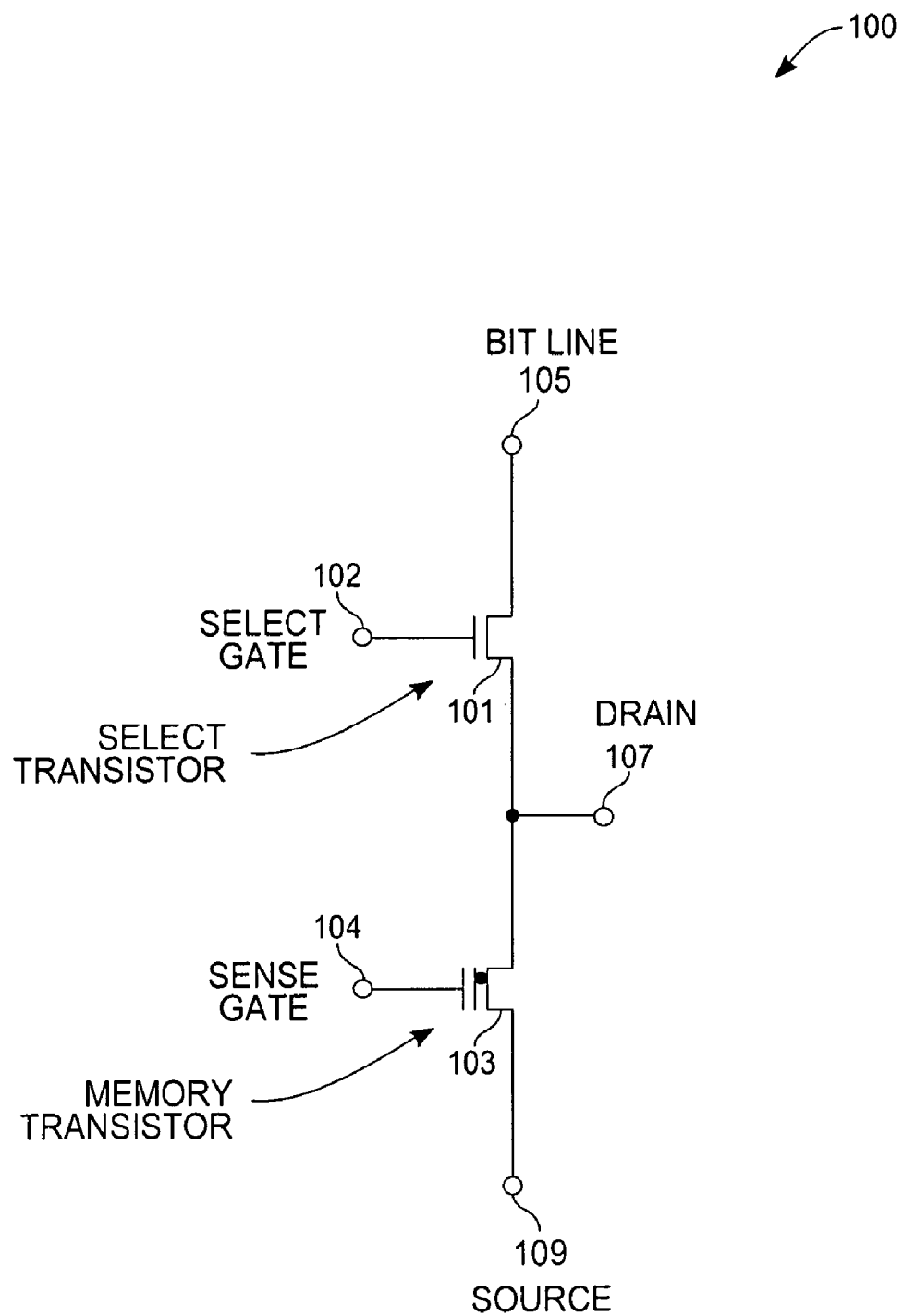
FIG. 1 is a schematic diagram of an exemplary EEPROM memory cell.

Referring to FIG. 1, an EEPROM memory cell 100 includes a select transistor 101 and a memory transistor 103. The exemplary EEPROM memory cell 100 uses a PMOS FET for the select transistor 101 and NMOS for the memory transistor 103. The select transistor 101 has a select gate 102 terminal, a bit line terminal 105, a drain junction 107, and a source terminal 109. The memory transistor 103 has a sense gate terminal 104.

Figure 2:
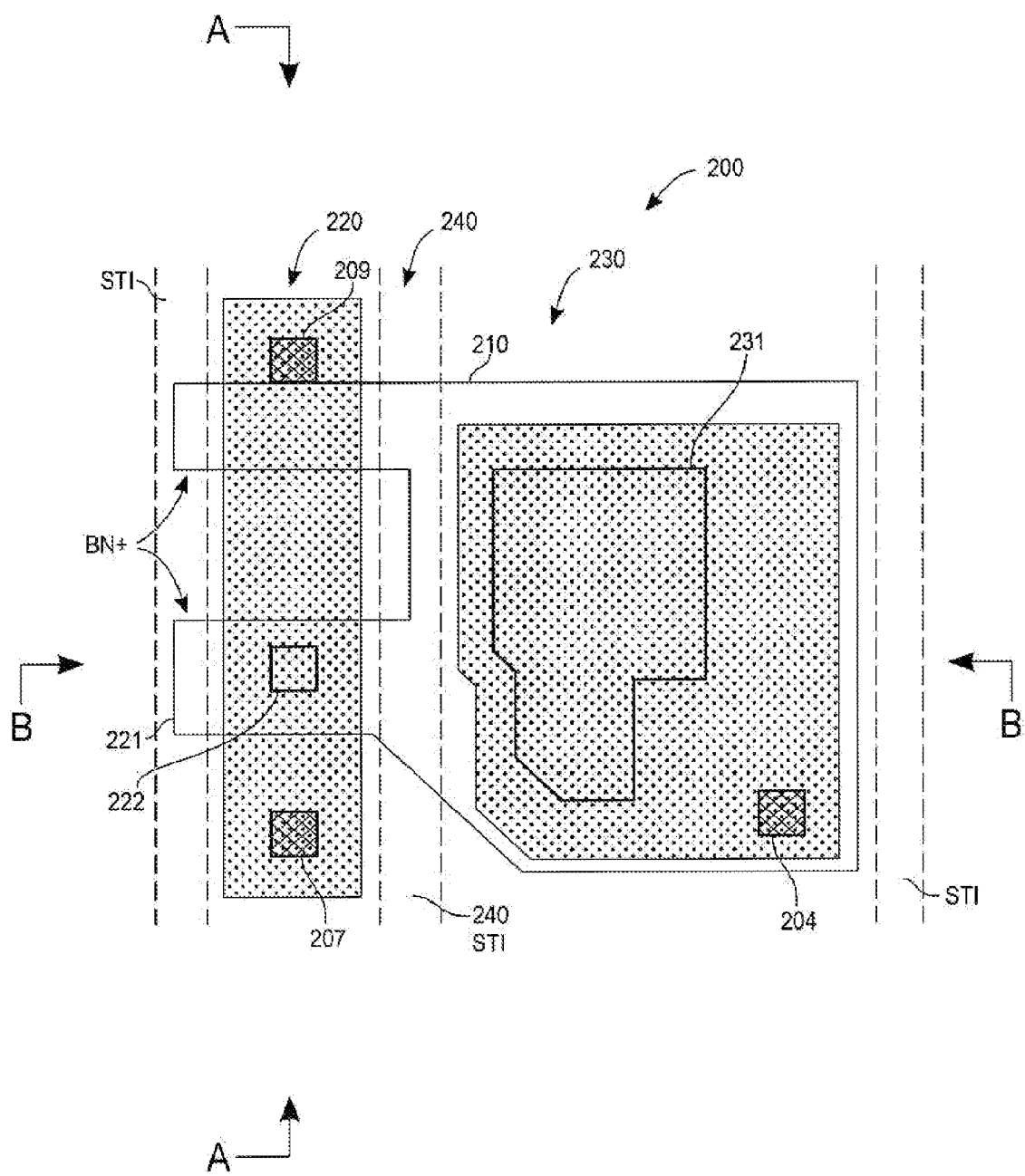
FIG. 2 is an exemplary layout diagram of an EEPROM memory transistor cell of FIG. 1.

Referring to FIG. 2, a layout of an FEPROM memory transistor 200 corresponds with the schematic elements in FIG. 1. The memory transistor 200 has a sense gate junction 204, a source junction 209, a tunnel diode window 222, and a drain junction 207. The exemplary FEPROM memory transistor 200 uses a buried (BN+) shallow implant region 210, generally located under the floating gate region. The layout of the entire floating gate region is not shown in FIG. 2. The BN+ implant region 210, without any gaps, includes extensions to the vicinity of a tunnel diode window region 220, and a coupling canacitor region 230. The BN+ implant region 210 is cut and separated by a shailos trench isolation (STI) region 240. STI regions are generally formed to electrically isolate a variety of devices that are formed in an integrated circuit. For example, a buried junction of a control gate may experience an electrical break dorn due to relatively high voltages applied to EEPROM devices on the same integrated circuit.

Referring to FIG. 2, a layout of an EEPROM memory transistor 200 corresponds with the schematic elements in FIG. 1. The memory transistor 200 has a sense gate junction 204, a source junction 209, a tunnel diode window 222, and a drain junction 207. The exemplary EEPROM memory transistor 200 uses a buried (BN+) shallow implant region 210, generally located under the floating gate region. The layout of the located floating gate region. The layout of the entire floating gate region is not shown in FIG. 2. The BN+implant region 210, without any gaps, includes extensions to the vicinity of a tunnel diode window region 220, and a coupling capacitor region 230. The BN+implant region 210 is cut and seperated by a shallow trench isolation (STI) region 240. STI regions are generally formed to electrically isolate a variety of devices that are formed in an integrated circuit. For example, a buried junction of a control gate may experience an electrical break down due to relatively high voltages applied to EEPROM devices on the same intergrated circuit.

With continued reference to FIGS. 1 and 2, and 120W referring to FIG. 3, a first cross-sectional view of the EEPROM memory transistor 200 corresponds to the layout elements in FIG. 2 at section AA. The memory transistor 200 includes the sense gate junction 104, the source junction 109, and the drain junction 107. The floating gate 331 of the memory transistor 200 is approximately located over a first area having a tunnel diode window region 322. Extensions of the buried (BN+) shallow implant region 210 are formed under the floating gate region 331 and under the tunnel diode window region 322 at the floating gate.

Referring to FIG. 4, a second cross-sectional view of the EEPROM memory transistor corresponds to the layout elements in FIG. 2 at section BB. The memory transistor 200 includes a buried control gate 403, a floating gate region 331, an oxide layer 450, and a tunnel diode window region 322 comprised of a tunneling extension 423 below the floating gate region 331. A control gate terminal 408 is electrically coupled to the buried control gate 403. An STI region 240 separates the buried (BN+) shallow implant regions below the floating gate region 331. Additional STI regions 441 may be used to separate the EEPROM memory transistor 200 from a select transistor and other devices.

Referring again to FIG. 2, the process of forming the STI 240 regions cuts and separates the BN+ shallow implant region 210 into multiple BN+ shallow implant regions (411 and 403 in FIG. 4), as shown by the cross sectional view of the STI 240 in FIG. 4. Referring again to FIG. 4, since the shallow BN+ shallow implant region 411 does not reach the bottom of the STI 240 field, the STI is effective in isolating the buried control gate 403 region from the tunnel diode window 423 region. The STI isolation between the buried control gate 403 region and the tunnel diode window 423 region provides a high breakdown voltage of over 10 volts.

A sinker dopant, which is normally used in a bipolar process to fabricate an NPN (or PNP) type transistor, is employed to dope regions within an exemplary EEPROM memory transistor. By doping regions in the EEPROM memory transistor area using a sinker dopant, the need to use a BN+ shallow implant and the related process steps are eliminated. However, if a sinker dopant replaces the entire BN+ shallow implant, the sinker dopant will be deep enough to extend below an isolating STI, and the active regions will be electrically coupled or short-circuited. The sinker implant is separated into multiple (e.g., first, second, and third) doped regions.

Figure 5:
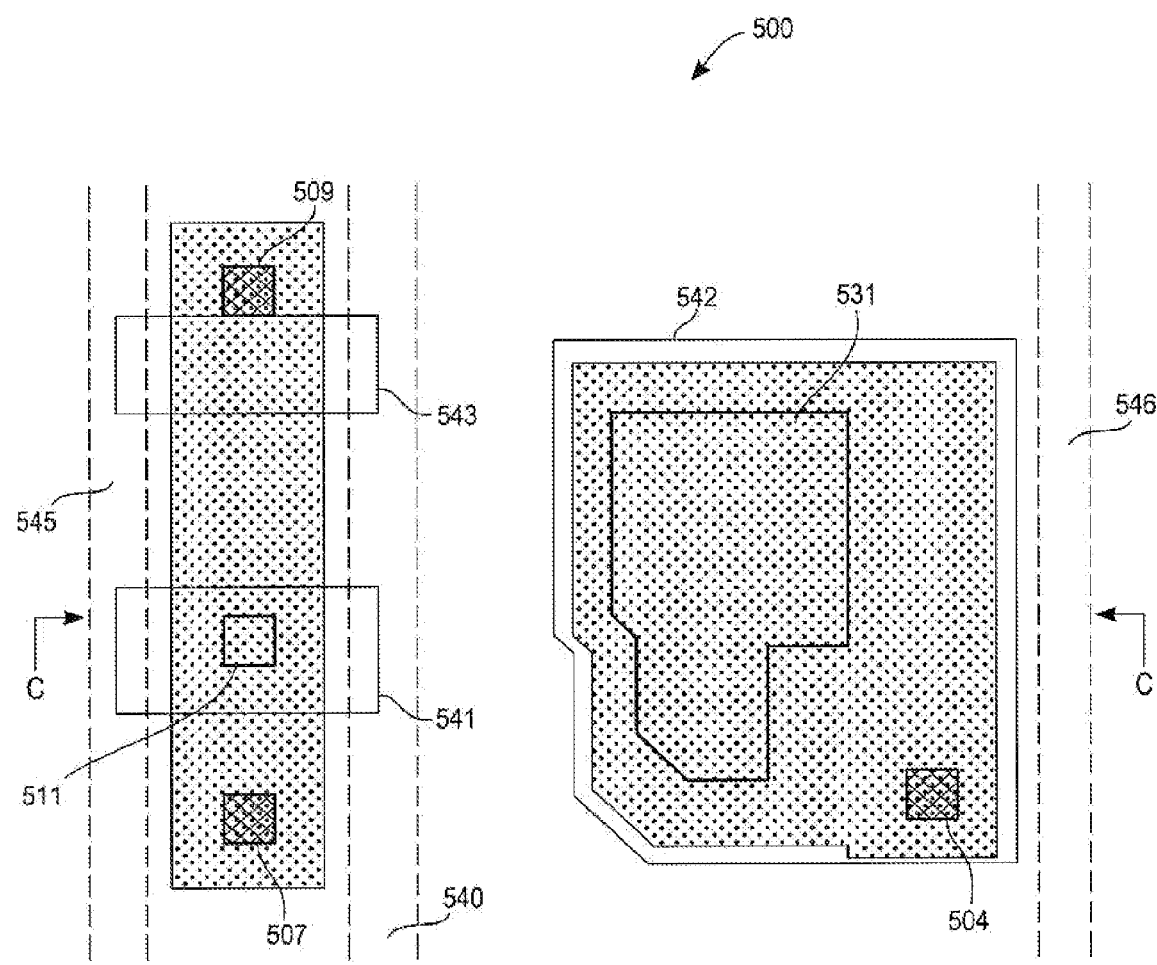
FIG. 5 is a layout diagram of an exemplary EEPROM memory transistor of FIG. 1 using multiple sinker implants.

Referring to FIG. 5, a (BiCMOS) sinker dopant or implant process forms multiple sinker dopants or implants in the layout 500 of an exemplary EEPROM memory transistor. A dopant may be introduced at the surface of a substrate, and implanted or diffused into the substrate, and for example, driven into the substrate using a high-temperature deep diffusion or annealing process. The sinker dopant or implant process forms multiple separate N+ sinker regions in the EEPROM memory transistor. A first sinker dopant region 541 is proximate to the tunnel diode window (TDW) 511 of the EEPROM memory transistor, and a second sinker dopant region 542 is proximate to the coupling capacitor area 531 or the control gate area of the EEPROM memory transistor. A third sinker dopant region 543 is proximate to the source junction 509 of the EEPROM memory transistor. The layout gaps or spaces between each of the sinker dopant regions are sufficiently large to electrically isolate each sinker region and to yield a breakdown voltage of approximately or at least 10 Volts. A shallow trench isolation (STI) region 540 may also be used to improve the electrical isolation of the sinker dopant regions 541, 542, 543.

The process steps to form the sinker regions may be used to develop both high voltage memory devices and low voltage MOS and bipolar devices on the same substrate. Referring to FIG. 6, the surface of a base substrate 601 is cleaned and a first epitaxial layer 603 is grown over the surface of the substrate. A specific embodiment of the substrate 601 is silicon that contains a p-type dopant, however, another elemental group IV semiconductor or compound semiconductor (e.g., groups III–V or II–VI) may be selected for base substrate 601. For a p-type silicon base substrate 601, the epitaxial deposition layer 603 will also contain a p-type dopant.

A thin oxide layer (not shown) is then grown over the epitaxial layer 603. The oxide layer is patterned according to the layout diagram of FIG. 5 for a first deep implant or doped first sinker region 541 proximate to the tunnel diode window 511, a second sinker region 542 proximate to the coupling capacitor 531, and a third sinker region 543 proximate to a source terminal 509. Using the oxide layer as a mask, an N+ type dopant is then formed in the epitaxial layer, and an anneal step is later used to drive the dopants into the substrate forming the N+ sinker regions. In this specific embodiment, the sinker dopant regions are greater than or approximately equal to 0.35 micrometers (µm) in depth. The sinker dopant regions may also be formed by a single implant or by a stacked set of implants where the junction depth exceeds 0.30 micrometers (µm). The N+ type sinkers may be formed, for example, by implanting phosphorus in the epitaxial layer. The resulting first sinker region 541 under the tunnel diode window region 511 and the second sinker region 542 for the coupling capacitor for the exemplary EEPROM memory transistor are shown in FIG. 6.

An EEPROM memory transistor 600 area has been formed over a base substrate 601 and an epitaxial deposition layer 603. The transistor area includes a first N+ sinker region 541 associated with a tunnel diode window region and a second N+ sinker region 542 associated with a control gate. With the multiple N+ sinker regions formed, the remaining process steps to complete the formation of an EEPROM memory transistor (or other MOS devices), and either NPN or PNP devices are performed.

The following exemplary steps are performed to form the remainder of the structures for an EEPROM memory transistor. A shallow trench isolation (STI) 540 structure is formed in the substrate between the first and third sinker regions 541, 543 (in FIG. 5) and the second sinker region 542. Formation of an STI 540 structure is optional but included in the exemplary embodiment to improve the isolation between adjoining transistor structures and devices. A patterned layer (not shown) or film stack (not shown) is formed over the epitaxial layer 603 and N+ sinker regions 608, 541, 542. The patterned layer or film stack may include an oxide or a nitride layer that is patterned and that serves as an etch mask for the formation of the shallow trench isolation (STI) structure 640.

The patterned layer, epitaxial layer, and substrate are then etched, producing an STI trench (not shown).

Next, an oxide is formed, for example by a chemical vapor deposition (CVD) process, filling the STI trench. Alternatively, an undoped silicate glass (USG) may be used to fill the STI trench. The patterned layers are then stripped and the STI trench fill material is planarized, for example by a chemical mechanical planarization (CMP) process, leaving the STI structure 540, 545, 546 co-planar with the N+ sinker regions and the uppermost surface of the epitaxial deposition layer 603. The final STI structure provides an increased electrical isolation between the N+ sinker regions 541, 542.

The EEPROM memory transistor region also includes a gate oxide region 650, a tunnel diode window (TDW) region 511, a polysilicon gate region 531, a sense gate terminal 504, and a source terminal 509. The first sinker region 541 under the tunnel diode window region 511 forms a drain region for the EEPROM memory transistor, and the second sinker region 542 forms the bottom plate of a coupling capacitor and control gate or sense gate. The gate oxide layer 650 may be formed as two oxide layers: a first oxide layer to form the tunnel diode window region 511 and to form the control gate region 531 coupling capacitor, and a second oxide layer to form the remaining oxide below the floating gate. The gate oxide layer 550 is generally either thermally grown or CVD deposited. In a specific embodiment the tunnel diode window oxide is approximately 7 nm thick. The polysilicon gate oxide region 531 is generally deposited by a thermal process, and a control gate contact 504 is later formed.

Following the completion of the process steps to form the EEPROM memory transistor region 600, conventional methods are used to form contacts and interconnect structures to electrically couple the terminals or junctions of the EEPROM memory transistor. Electronic-test and packaging steps are also used to complete a semiconductor memory device.

Presented in this invention is an NPN sinker dopant or implant under the oxide tunnel diode window and coupling capacitor of an EEPROM memory cell. Those of skill in the art will recognize that the invention can be practiced with modification and alteration within the spirit and scope of the appended claims and many other embodiments will be apparent to those of skill in the art upon reading an understanding the description presented herein. For example, a skilled artisan will realize that the invention may be fabricated in other ways for example, alternate N or P type structures may be formed, for example, optional P+ type sinker regions may be formed by using boron as a dopant, and buried layers for any NPN or PNP devices may be formed by well known masking, implanting and anneal process steps.

What is claimed is:

1. A memory transistor comprising:
   a first sinker dopant region and a second sinker dopant region formed in a substrate, the first sinker dopant region being separate from the second sinker dopant region, wherein a distance between the first and second sinker dopant regions is sufficient to electrically isolate the first and second sinker dopant regions from each other and to yield a breakdown voltage of greater than or approximately equal to 10 Volts;
   a tunnel oxide region formed over the first sinker dopant region;
   a coupling capacitor oxide region formed over the second sinker dopant region; and
   a floating gate formed proximate to both the first and second sinker dopant regions, the floating gate having a tunnel diode window region over the tunnel oxide region and separated from the first sinker dopant by the tunnel oxide, the floating gate having a coupling capacitor region over the coupling capacitor oxide region and separated from the second sinker dopant by the coupling capacitor oxide.

2. The memory transistor of claim 1 further comprising a third sinker dopant region formed in the substrate, the third sinker dopant region being separated from both the first and second sinker dopant region, thereby forming a source junction region.

3. The memory transistor of claim 1 wherein the first and second sinker dopant regions are greater than or approximately equal to 0.3 micrometers (μm) in depth.

4. The memory transistor of claim 1 wherein the first and second sinker dopant regions each are formed with an N-type dopant.

5. The memory transistor of claim 4 wherein the N-type dopant is formed using arsenic, phosphorus or antimony.

6. The memory transistor of claim 1 further comprising a shallow trench isolation (STI) region located between the first and second sinker dopant regions.

7. The memory transistor of claim 1 wherein the memory transistor is an MOS device.

8. The memory transistor of claim 1 wherein the memory transistor is electrically coupled to a select transistor in a memory cell.

9. A memory transistor comprising:
   a first sinker implant region and a second sinker implant region formed in a substrate, the first and second sinker implant regions being separated from each other, wherein a distance between the first and second sinker implant regions is sufficiently large to electrically isolate the first and second sinker implant regions from each other and to yield a breakdown voltage of greater than or approximately equal to 10 Volts;
   a tunnel oxide region formed over the first sinker implant region;
   a coupling capacitor oxide region formed over the second sinker implant region; and
   a floating gate formed proximate to both the first and second sinker implant regions, the floating gate having a tunnel diode window region over the tunnel oxide region and separated from the first sinker implant by the tunnel oxide, the floating gate having a coupling capacitor region over the coupling capacitor oxide region and separated from the second sinker implant by the coupling capacitor oxide.

10. The memory transistor of claim 9 wherein the first and second sinker implant regions are greater than or approximately equal to 0.3 micrometers (μm) in depth.

11. The memory transistor of claim 9 wherein the first and second sinker implant regions are formed by a single implant.

12. The memory transistor of claim 9 wherein the first and second sinker implant regions are each formed by a stacked set of implants.

13. The memory transistor of claim 9 wherein the first, and second sinker implant regions are N-type implants.

14. The memory transistor of claim 13 wherein the N-type implant is formed using arsenic, phosphorus, or antimony.

15. The memory transistor of claim 9 further comprising a shallow trench isolation (STI) region located between the first and second sinker implant regions.

16. The memory transistor of claim 9 wherein the memory transistor is an MOS device.

17. The memory transistor of claim 9 wherein the memory transistor is electrically coupled to a select transistor in a memory cell.

18. The memory transistor of claim 9 further comprising a third sinker implant region formed in the substrate, the third sinker implant region being separate from both the first and second sinker implant regions, thereby forming a source junction region.

19. A method of fabricating an MOS memory transistor using a BiCMOS process, the method comprising:
forming a first dopant region using a first dopant and a second dopant region using a second dopant on a substrate, wherein an epitaxial layer is formed on the substrate and the dopant regions are formed within the epitaxial layer;
performing a heating step, driving the first dopant and second dopant into the substrate to form a corresponding first and second doped sinker region, the first doped sinker region being separated, from the second doped sinker region; and
forming structural features of a memory transistor including the steps of forming a tunnel oxide and floating gate tunnel diode window over the first dopant region, and forming a coupling capacitor oxide region and floating gate coupling capacitor region over the second dopant region.

20. The method of fabricating an MOS memory transistor of claim 19, further comprising forming at least one shallow trench isolation (STI) region between the first and second dopant regions.

21. The method of fabricating an MOS memory transistor of claim 19, further comprising forming a third sinker dopant region to form a source junction of the MOS memory transistor.

22. The method of fabricating an MOS memory transistor of claim 19, further comprising forming an MOS transistor proximate to and electrically coupled to the memory transistor, the MOS transistor serving as a select transistor in the memory cell.

23. The method of fabricating an MOS memory transistor of claim 19 wherein the epitaxial layer is a P-type epitaxial layer.

24. The method of fabricating an MOS memory transistor of claim 19 wherein the first and second doped sinker regions are formed by a single implant.

25. The method of fabricating an MOS memory transistor of claim 19 wherein the first and second doped sinker regions are formed by a stacked set of implants.

26. The method of fabricating an MOS memory transistor of claim 19 wherein the dopants are N-type implants.

27. The method of fabricating an MOS memory transistor of claim 26 wherein the N-type dopant is formed using arsenic, phosphorus, or antimony.

28. The method of fabricating an MOS memory transistor of claim 19 further comprising driving the first and second dopants to a depth of greater than or approximately equal to 0.3 micrometers ($\mu$m) into the substrate during the heating step.

* * * * *